(12) United States Patent
Fujiyoshi et al.

(10) Patent No.: US 6,965,623 B2
(45) Date of Patent: Nov. 15, 2005

(54) SEMICONDUCTOR LASER DEVICE AND METHOD OF MANUFACTURING THE SAME

(75) Inventors: Miki Fujiyoshi, Takatsuki (JP); Hiroki Uemura, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 237 days.

(21) Appl. No.: 10/305,145

(22) Filed: Nov. 27, 2002

(65) Prior Publication Data

US 2003/0133481 A1   Jul. 17, 2003

(30) Foreign Application Priority Data

Nov. 27, 2001  (JP)  ............................ 2001-360709
Oct. 21, 2002  (JP)  ............................ 2002-305973

(51) Int. Cl.[7] ................................................ H01S 3/00
(52) U.S. Cl. ....................... 372/38.05; 372/43; 372/46; 372/29.013
(58) Field of Search .................. 372/38.05, 43, 372/46

(56) References Cited

U.S. PATENT DOCUMENTS 3,688,388 A * 9/1972 Dyment et al. ............... 438/33
5,729,561 A * 3/1998 Hironaka ....................... 372/36
5,895,938 A * 4/1999 Watanabe et al. ............. 257/77

FOREIGN PATENT DOCUMENTS

| JP | 2000-222768 A | 8/2000 |
| JP | 2001-189516 A | 7/2001 |
| JP | 2002-094166 A | 3/2002 |
| JP | 2002-185069 A | 6/2002 |

* cited by examiner

*Primary Examiner*—Minsun Oh Harvey
*Assistant Examiner*—Dung (Michael) T. Nguyen
(74) *Attorney, Agent, or Firm*—Birch, Stewart, Kolasch & Birch, LLP

(57) ABSTRACT

In the semiconductor laser device of the present invention, a P-type diffusion region 3A is disposed in an N⁻ epitaxial layer 2 of a silicon submount 16, and an N-type diffusion region 4A is disposed in this P-type diffusion region 3A. The P-type diffusion region 3A and the N-type diffusion region 4A are positioned under a red laser diode 14, and the red laser diode 14 is directly connected on the N-type diffusion region 4A via electrodes 7, 8 without an insulating film. Consequently, a short circuit between the red laser diode 14 and the silicon submount 16 can be prevented. Therefore, according to this semiconductor laser device, occurrence of deterioration or failure of a semiconductor light-emitting element upon a high-temperature operation can be prevented.

11 Claims, 5 Drawing Sheets

SEMICONDUCTOR LASER DEVICE AND METHOD OF MANUFACTURING THE SAME

BACKGROUND OF THE INVENTION

The present invention relates to a semiconductor laser device particularly in which a plurality of semiconductor laser elements including a semiconductor laser element that is easily deteriorated upon a high-temperature operation are mounted on the same semiconductor submount, and a method of manufacturing the same.

Since a material of each semiconductor laser element is different in a semiconductor laser device in which a plurality of semiconductor laser elements with different emission wavelengths are included in one package, a temperature characteristic of one semiconductor laser element becomes worse than those of other semiconductor laser elements (for example, see Patent Literatures 1, 2). Specifically, when temperature is changed by 1° C., for example, characteristics such as light-emitting efficiency and an oscillation threshold are largely changed in one semiconductor laser element in comparison with those of other semiconductor laser elements.

More specifically, for example, in a semiconductor laser device in which an infrared laser element with a wavelength in a 780 nm band and a red laser element with a wavelength in a 650 nm band are die-bonded on a same silicon submount, a temperature characteristic of the red laser element is poorer than that of the infrared laser element. Therefore, it is necessary to place a light-emitting section of the red laser element (a portion on a pn-junction surface) closer to the silicon submount to reduce heat resistance and an operation current upon a high-temperature operation so that breakdown and deterioration of the laser are prevented.

Furthermore, when the aforementioned semiconductor laser device, which is a two-wavelength semiconductor laser device, is incorporated into a light pickup, light reflected on an optical disc is made incident to and reflected on an end surface of the infrared laser element. To prevent the light reflected on the end surface of the infrared laser element from returning to a light pickup optical system, an emission point of the infrared laser element is preferably positioned at a center in a chip-height direction. At this time, an N-type side of the infrared laser element is preferably die-bonded on the silicon submount to prevent deterioration of the temperature characteristic of the infrared laser element where possible.

FIG. 5 is a schematic cross-sectional view showing a substantial part of a conventional two-wavelength semiconductor laser device viewed from its front. FIG. 6 is a schematic view showing a cross-section along line VI—VI in FIG. 5. That is, FIG. 6 is a schematic cross-sectional view of the two-wavelength semiconductor laser device viewed from its side.

As shown in FIG. 5, the two-wavelength semiconductor laser device includes a silicon submount 116 with a photodiode, a red laser chip 114 and an infrared laser chip 115 die-bonded on this silicon submount 116 with a photodiode.

The red laser chip 114 is a 650-nm band laser chip, and has a structure with a junction-side down constituted by a P-type layer 109 having a thickness of 5–6 μm and an N-type layer 110 having a thickness of about 110 μm to improve heat dissipation and reduce heat resistance.

The infrared laser chip 115 is a 780-nm band laser chip and is constituted by an N-type layer 111 having a thickness of about 40 μm and a P-type layer 112 having a thickness of about 70 μm so that an active layer (a layer on a junction surface of the P-type layer 112 and the N-type layer 111) is positioned at a center in a chip height direction to prevent return light.

The red laser chip 114 and the infrared laser chip 115 are die-bonded on the silicon submount 116 with a photodiode so that their polarities on the side of the silicon submount 116 with a photodiode are different from each other. Therefore, an insulating film 105 made of $SiO_2$ or the like is formed so as to cover a surface (die-bonded surface) of the silicon submount 116 with a photodiode so that the red laser chip 114 and the infrared laser chip 115 are electrically isolated.

Furthermore, an Al layer 106, TiW layer (not shown) as a barrier metal, Au layer 107 and AuSn layer 108 are successively formed on the insulating film 105. The Al layer 106 is provided to have an ohmic contact with Si, and the Au layer 107 is provided to increase adhesion to the AuSn layer 108. Furthermore, the AuSn layer 108 is provided for a junction with Au electrodes on rear surfaces of the laser chips. That is, the red laser chip 114 and the infrared laser chip 115 are die-bonded on the AuSn layer 108.

The silicon submount 116 with a photodiode is constituted by an $N^+$-type substrate 101 and an $N^-$ epitaxial layer 102 formed on this $N^+$-type substrate 101. As shown in FIG. 6, a P-type diffusion region 103, which is to serve as a light-receiving portion of the photodiode, is disposed on the $N^-$ epitaxial layer 102.

FIG. 7 is a schematic plan view showing the two-wavelength semiconductor laser device viewed from the die-bonded surface side to show the P-type diffusion region 103 of the silicon submount 116 with a photodiode. To simplify the figure, the red laser chip 114 and the infrared laser chip 115 are not shown in FIG. 7.

When light emitted from end surfaces of the red laser chip 114 and the infrared laser chip 115 on the P-type diffusion region 103 side is made incident to the P-type diffusion region 103, which is a light-receiving portion, an output can be obtained depending on an optical power of the light. Consequently, an output (laser optical power) of the light emitted from end surfaces of the red laser chip 114 and the infrared laser chip 115 on the opposite side of the P-type diffusion region 103 is monitored. It is noted that there is one P-type diffusion region 103, which is a light-receiving portion since the red laser chip 114 and the infrared laser chip 115 do not need to light simultaneously.

Patent Literature 1

Japanese Patent Laid-Open Publication No. 2000-222768

Patent Literature 2

Japanese Patent Laid-Open Publication No. 2001-189516

However, in the conventional two-wavelength semiconductor laser device, heat dissipation is poor since the insulating film 105 is disposed immediately under electrodes of the red laser chip 114 and the infrared laser chip 115. That is, heat of the red laser chip 114 and the infrared laser chip 115 cannot be efficiently dissipated. As a result, deterioration or failure easily occurs particularly in the red laser chip 114 upon a high-temperature operation.

Since a 650-nm band red laser is less efficient than a 780-nm band infrared laser under a high temperature atmosphere due to their difference in materials and bandgap structure, a current is increased, or deterioration or failure occurs upon a high-temperature operation.

SUMMARY OF THE INVENTION

Accordingly, an object of the present invention is to provide a semiconductor laser device with which occurrence of deterioration or failure in a semiconductor laser element upon a high-temperature operation can be prevented, and a method of manufacturing the same.

In order to achieve the above object, an insulating film immediately under a laser chip is omitted, and heat resistance and heat dissipation are improved by a direct junction with a silicon submount substrate via an electrode in the present invention.

Namely, there is provided a semiconductor laser device comprising a semiconductor submount of a first conductive type and first and second semiconductor laser elements which are die-bonded on this semiconductor submount and whose polarities on the semiconductor submount side are different from each other, wherein the semiconductor submount includes a first diffusion region of a second conductive type and a second diffusion region of the first conductive type formed in this first diffusion region so as to be positioned under the first semiconductor laser element, and the first semiconductor laser element is connected on the second diffusion region via an electrode.

According to the semiconductor laser device having the above constitution, since the first semiconductor laser element is directly connected on the second diffusion region of the semiconductor submount via an electrode without an insulating film, heat resistance under the first semiconductor laser element is reduced, and heat dissipation of the first semiconductor laser element is improved. Therefore, heat of the first semiconductor laser element is efficiently released, and deterioration or failure of the first semiconductor laser element upon a high-temperature operation can be prevented.

Furthermore, since the first and second diffusion regions of different conductive types are disposed under the first semiconductor laser element in this semiconductor submount, a short circuit of the first semiconductor laser element with the semiconductor submount can be prevented.

In one embodiment of the present invention, the electrode for mounting the first semiconductor laser element has a structure of TiW, Au and AuSn from the semiconductor submount side.

According to the semiconductor laser device of this embodiment, when the semiconductor submount is made of, for example, Si, and the electrode contains Al, the Al reacts with Si of the semiconductor submount, thereby generating a crystal defect in the semiconductor submount. Then, AuSn penetrating TiW easily enters the crystal defect. That is, a so-called spike of AuSn easily occurs. Therefore, since the electrode does not contain Al and a structure of TiW, Au and AuSn from the semiconductor submount side is provided, such a spike of AuSn can be prevented.

In one embodiment of the present invention, an electrode for mounting the second semiconductor laser element has a structure of TiW, Au and AuSn from the semiconductor submount side.

According to the semiconductor laser device of this embodiment, when the semiconductor submount is made of, for example, Si, and the electrode contains Al, the Al reacts with Si of the semiconductor submount, thereby generating a crystal defect in the semiconductor submount. Then, AuSn penetrating TiW easily enters the crystal defect. That is, a so-called spike of AuSn easily occurs. Therefore, since the electrode does not contain Al and a structure of TiW, Au and AuSn from the semiconductor submount side is provided, such a spike of AuSn can be prevented.

In one embodiment of the present invention, a film thickness of the TiW is 300–750 nm.

According to the semiconductor laser device of this embodiment, the melted AuSn layer does not penetrate the TiW layer by setting a film thickness of TiW to be 300–750 nm.

When the film thickness of the TiW layer is set to be less than 300 nm, the melted AuSn layer penetrates the TiW layer.

When the film thickness of the TiW layer is set to exceed 750 nm, a bending occurs in a wafer (substrate), or a crack occurs in the TiW layer.

In one embodiment of the present invention, a diffusion depth of the second diffusion region is 1.5–4.0 $\mu$m.

According to the semiconductor laser device of this embodiment, when the first semiconductor laser element is die-bonded on the semiconductor submount, a melted electrode may be projected towards the semiconductor submount. At this time, when a diffusion depth of the second diffusion region is set to be 1.5–4.0 $\mu$m, the melted electrode does not reach the first diffusion region. Therefore, a short circuit of the electrode with the first diffusion region can be prevented.

When the diffusion depth of the second diffusion region is less than 1.5 $\mu$m, the melted electrode reaches the first diffusion region. That is, the short circuit of the electrode with the first diffusion region cannot be prevented. Specifically, when the electrode contains, for example, Al, AuSn penetrates TiW and reacts with Al. Since the spike depth at this time is less than 1.5 $\mu$m, a short circuit of the electrode with the first diffusion region occurs due to the occurrence of a spike when the diffusion depth of the second diffusion region is less than 1.5 $\mu$m.

Furthermore, in order to allow the diffusion depth of the second diffusion region to exceed 4.0 $\mu$m, the first diffusion region needs to be set to be 5.0 $\mu$m or greater. As a result, diffusion time of the first and second diffusion regions is increased. Specifically, for example, when the first conductive type is an N type and the second conductive type is a P type, and the diffusion depth of the second diffusion region exceeds 4.0 $\mu$m, the diffusion time of the first diffusion region of a P type cannot be reduced. Furthermore, when a light-receiving portion of the photodiode is formed on the semiconductor submount, and the light-receiving portion and the first diffusion region are simultaneously formed, recombination easily occurs, resulting in a lower monitor current.

In one embodiment of the present invention, the first semiconductor laser element is an AlGaInP 650-nm band red laser diode with a junction-side down, and the second semiconductor laser element is a GaAlAs 780-nm band infrared laser diode having an active layer positioned at a center in a height direction.

In one embodiment of the present invention, the semiconductor submount is made of Si, the first conductive type is an N type, and the second conductive type is a P type.

In one embodiment of the present invention, a photodiode for monitoring an output is formed on the semiconductor submount.

Also, there is provided a method of manufacturing the above semiconductor device, the temperature for melting AuSn is 360–400° C.

According to the method of manufacturing the semiconductor laser device having the above constitution, AuSn is melted, and a semiconductor laser element is mounted on the AuSn. At this time, when an electrode on a rear surface of the semiconductor laser element is, for example, an Au electrode, wettability of the AuSn and the Au electrode on the rear surface of the semiconductor laser element can be ensured by setting temperature for melting AuSn at 360–400° C. Furthermore, since the temperature for melting AuSn is 360–400° C., heat damage to the semiconductor laser element or penetrating of a barrier metal by AuSn can be prevented.

When the temperature for melting AuSn is lower than 360° C., wettability of AuSn for the Au electrode on the rear surface of the semiconductor laser element cannot be ensured.

When the temperature for melting AuSn exceeds 400° C., heat damage to the semiconductor laser element or penetrating of a barrier metal by AuSn cannot be prevented.

In one embodiment of the present invention, the second semiconductor laser element and the semiconductor submount are connected via the electrode of the second semiconductor laser element.

In one embodiment of the present invention, a third diffusion region of the first conductive type is included in the semiconductor submount so as to be positioned under the second semiconductor laser element, and the second diffusion region and the third diffusion region are electrically short-circuited.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of the semiconductor laser device of the present invention are described in detail with reference to the accompanying drawings.

Figure 1:
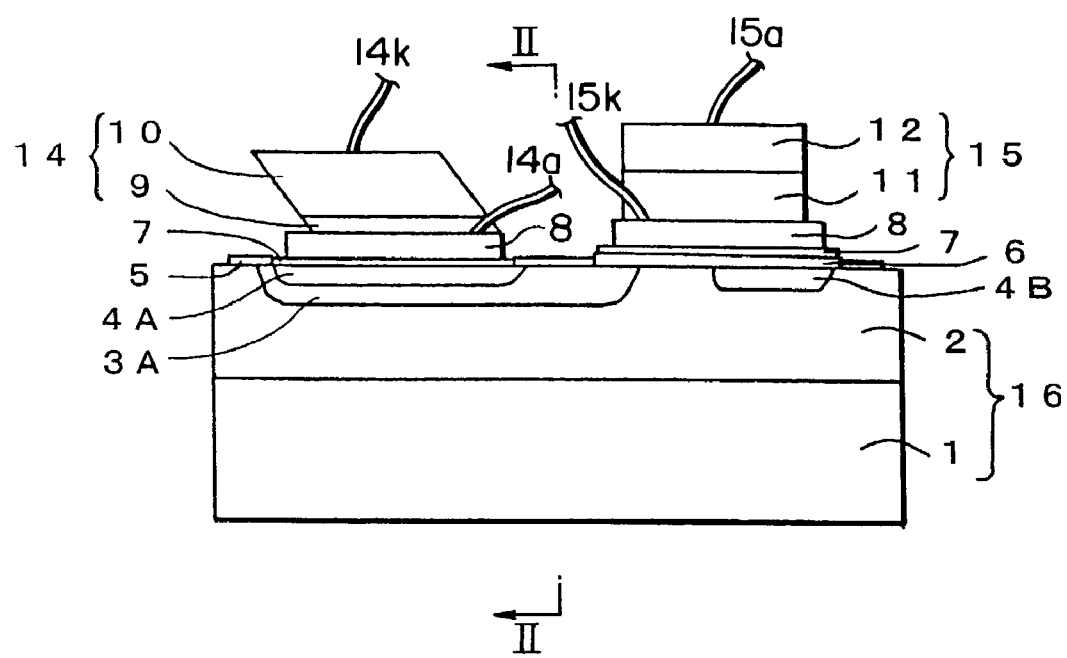
FIG. 1 is a schematic cross-sectional view showing a two-wavelength semiconductor laser device according to one embodiment of the invention.

FIG. 1 is a schematic cross-sectional view showing a two-wavelength semiconductor laser device, which is a semiconductor laser device according to one embodiment of the invention, viewed from its front side.

As shown in FIG. 1, the two-wavelength semiconductor laser device includes an N-type silicon submount 16, which has an insulating film 5 formed on its surface, as a semiconductor submount of a first conductive type, a red laser diode 14 die-bonded on this silicon submount 16 as a first semiconductor laser element and an infrared laser diode 15 die-bonded on the silicon submount 16 as a second semiconductor laser element.

The silicon submount 16 is constituted by an $N^+$-type substrate 1 and an $N^-$ epitaxial layer 2 formed on this $N^+$-type substrate 1. This $N^-$ epitaxial layer 2 includes a P-type diffusion region 3A as a first diffusion region of a second conductive type, and an N-type diffusion region 4A formed in this P-type diffusion region 3A as a second diffusion region of the first conductive type. The P-type diffusion region 3A and the N-type diffusion region 4A are positioned under the red laser diode 14. Furthermore, an N-type diffusion region 4B is included in the $N^-$ epitaxial layer 2 so as to be positioned under the infrared laser diode 15.

Furthermore, no insulating film 5 exists under the red laser diode 14 and infrared laser diode 15. Under the red laser diode 14, a region having no insulating film 5 faces the N-type diffusion region 4A. Meanwhile, under the infrared laser diode 15, a region having no insulating film 5 faces one end portion of the P-type diffusion region 3A and the N-type diffusion region 4B.

Furthermore, the red laser diode 14 is mounted on the N-type diffusion region 4A via an electrode. The electrode under the red laser diode 14 is constituted by a TiW electrode (not shown) as a barrier metal, Au electrode 7 and AuSn electrode 8. The TiW electrode, Au electrode 7 and AuSn electrode 8 are formed in this order from the die-bonded surface side of the silicon submount 16. The Au electrode 7 is provided to increase adhesion to AuSn, and the AuSn electrode 8 is provided for a junction with an Au electrode on a rear surface of the red laser diode 14.

Furthermore, the infrared laser diode 15 is mounted on the N-type diffusion region 4B via an electrode. The electrode under the infrared laser diode 15 is constituted by successively forming an Al layer 6, TiW layer (not shown) as a barrier metal, Au layer 7 and AuSn layer 8 from the silicon submount 16 side.

The red laser diode 14 is an AlGaInP 650-nm band red laser diode and has a P-type layer 9 and an N-type layer 10. Furthermore, to improve heat dissipation, the red laser diode 14 has a structure with a junction-side down, in which an active layer (a layer on a junction of the P-type layer 9 and the N-type layer 10) is located at a low position (a position close to the die-bonded surface).

The infrared laser diode 15 is a GaAlAs 780-nm band infrared laser diode and has an N-type layer 11 and a P-type layer 12. Furthermore, to prevent return light of light that illuminates an optical disc, an active layer (a layer on a junction of the P-type layer 11 and the N-type layer 12) is positioned about at a center of a chip height in the infrared laser diode 15.

Figure 2:
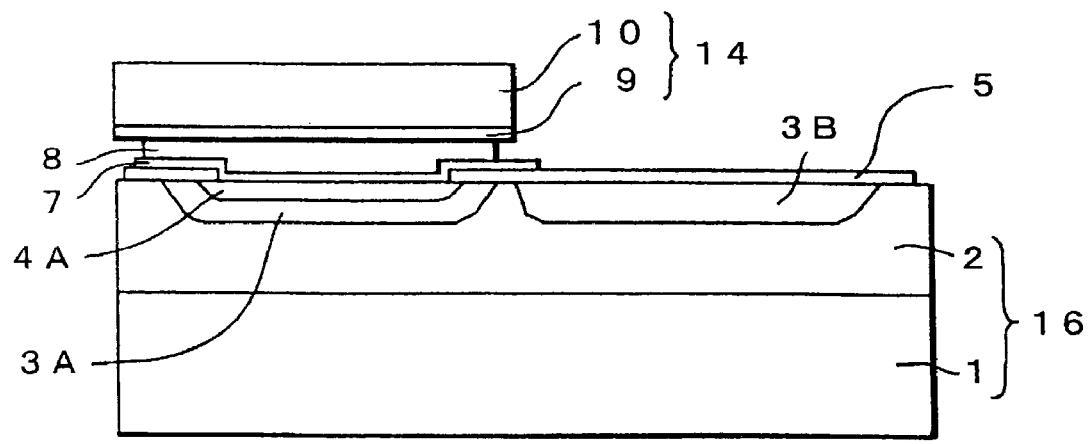
FIG. 2 is a schematic cross-sectional view showing the two-wavelength semiconductor laser device.
Figure 3:
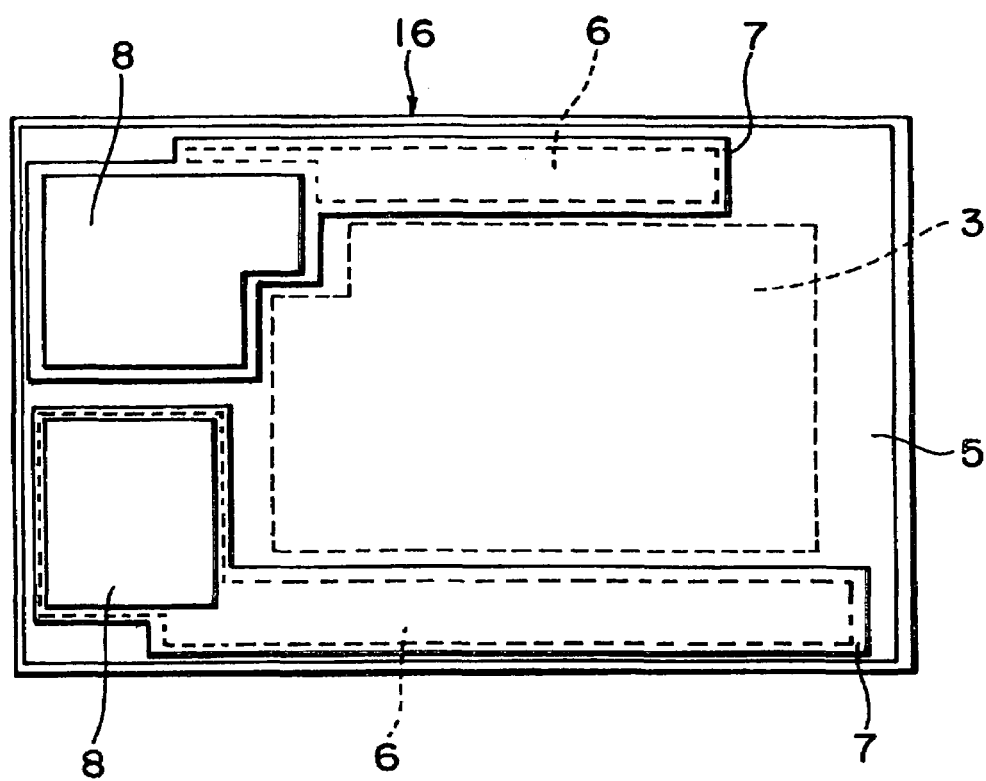
FIG. 3 is a schematic plan view showing the two-wavelength semiconductor laser device.

FIG. 2 is a schematic cross-sectional view showing the two-wavelength semiconductor laser device viewed from its side. FIG. 3 is a schematic plan view showing the two-wavelength semiconductor laser device viewed from its top. To simplify the figure, the red laser chip 14 and the infrared laser chip 15 are not shown in FIG. 3.

As shown in FIGS. 2 and 3, a P-type diffusion region 3B, which serves as a light-receiving portion of a photodiode for monitoring an output, is provided in the $N^-$ epitaxial layer 2 of the silicon submount 16. Consequently, the silicon submount 16 has a function of a photodiode for monitoring an output.

According to the two-wavelength semiconductor laser device having the above constitution, since no insulating film 5 exists under the red laser diode 14, heat resistance under the red laser diode 14 is reduced and heat dissipation of the red laser diode 14 is improved. Therefore, heat of the red laser diode 14 is efficiently released, and hence deterioration or failure of the red laser diode 14 upon a high-temperature operation can be prevented.

Furthermore, since no insulating film 5 exists under the infrared laser diode 15, heat of the infrared laser diode 15 is efficiently released, and hence deterioration or failure of the infrared laser diode 15 upon a high-temperature operation can be prevented.

Furthermore, since the P-type diffusion region 3A and the N-type diffusion region 4A are provided in a region positioned under the red laser diode 14 in this silicon submount 16, a short circuit between the red laser diode 14 and the silicon submount 16 can be prevented. That is, since the P-type diffusion region 3A and the N-type diffusion region 4A are provided in the N⁻ epitaxial layer 2 so as to be positioned immediately under the electrode of the red laser diode 14 to form a double-diffused structure (n-p-n structure) immediately under the electrode of the red laser diode 14, insulation immediately under the electrode of the red laser diode 14 is maintained.

Furthermore, the P-type diffusion region 3A is short-circuited with the N-type diffusion region 4B immediately under the infrared laser diode 15 via the Au electrode 7 and the Al electrode 6. Consequently, even when a positive potential is applied to the P-type layer 9 of the red laser diode 14, a short circuit between the red laser diode 14 and the silicon submount 16, which is a ground, can be prevented, and noise is hardly super-imposed on the red laser diode 14.

Figure 4:
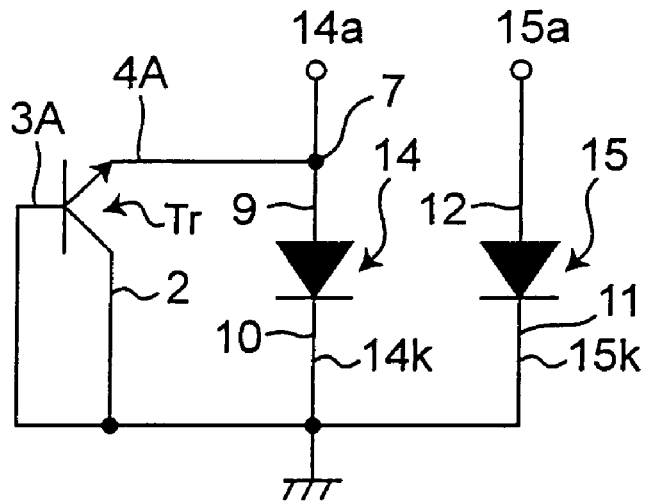
FIG. 4 is an equivalent circuit diagram of the two-wavelength semiconductor laser device.

FIG. 4 shows an equivalent circuit of the two-wavelength semiconductor laser device shown in FIGS. 1–3, and like circuit elements are designated by like reference numerals in FIGS. 1–3. In the figure, reference numerals 14a and 14k denote an anode terminal 14a connected to the electrode 8 on the P-type layer 9 side and a cathode terminal 14k connected to the electrode on the N-type layer 10 side, respectively, of the red laser diode 14 shown in FIG. 1. Reference numerals 15a and 15k denote an anode electrode 15a connected to the electrode on the P-type layer 12 side and a cathode terminal 15k connected to the electrode 8 on the N-type layer 11 side, respectively, of the infrared laser diode 15 shown in FIG. 1. In this two-wavelength semiconductor laser device, the double-diffused structure (n-p-n structure) constituted by the N-type diffusion region 4A, P-type diffusion region 3A and N⁻ epitaxial layer 2 successively formed immediately under the red laser diode 14 constitutes a transistor Tr shown in FIG. 4, and this transistor Tr is connected in parallel to the left side of the red laser diode 14 by a collector ground. Furthermore, since the N-type diffusion region 4B immediately under the infrared laser diode 15 has a sufficiently high impurity concentration, an ohmic contact is formed with the electrode 8 on the cathode terminal 15k side, and this infrared laser diode 15 is cathode-connected to the red laser diode 14 in parallel via an external circuit not shown in FIG. 1.

The red laser diode 14 is operated by applying forward voltage, i.e., a negative voltage to the anode terminal 14a and a positive voltage to the cathode terminal 14k, but a spike noise in a reverse direction may be mixed in from the outside upon an operation. There is an advantage that, in this case, the red laser diode 14 is hardly affected by the external noise since the transistor Tr connected in parallel conducts to allow the noise to bypass the red laser diode 14.

Figure 8:
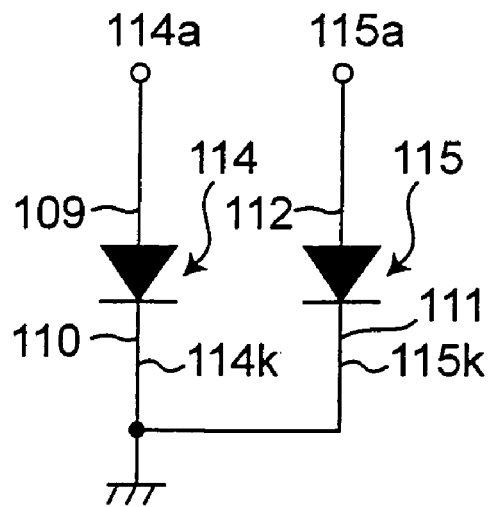
FIG. 8 is an equivalent circuit diagram of the conventional two-wavelength semiconductor laser device.
Figure 5:
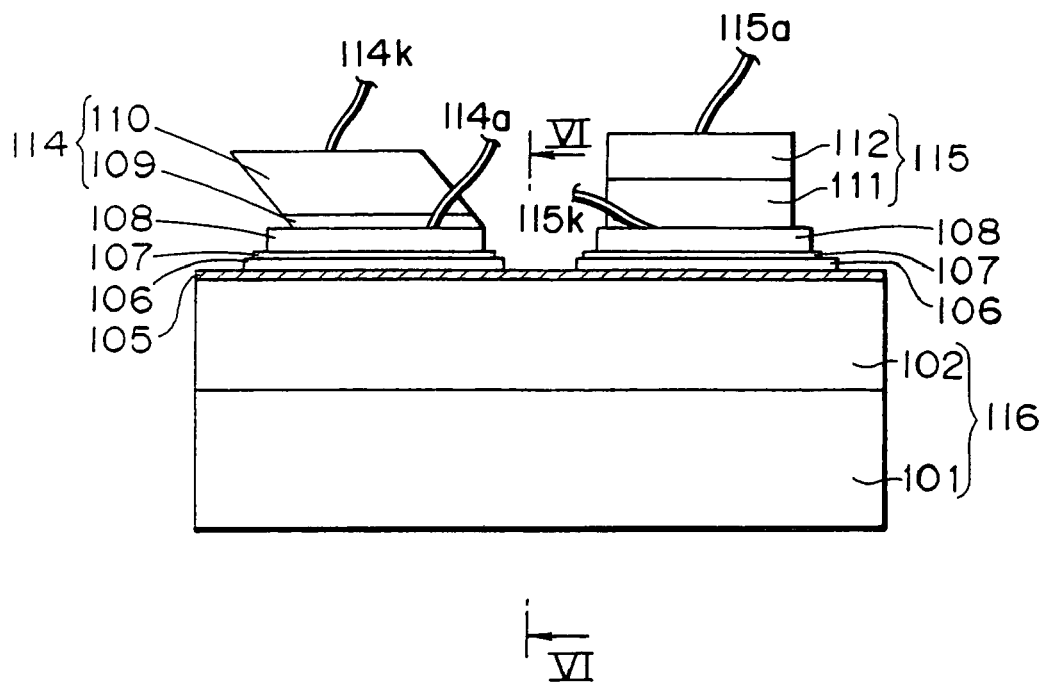
FIG. 5 is a schematic cross-sectional view showing a conventional two-wavelength semiconductor laser device.
Figure 6:
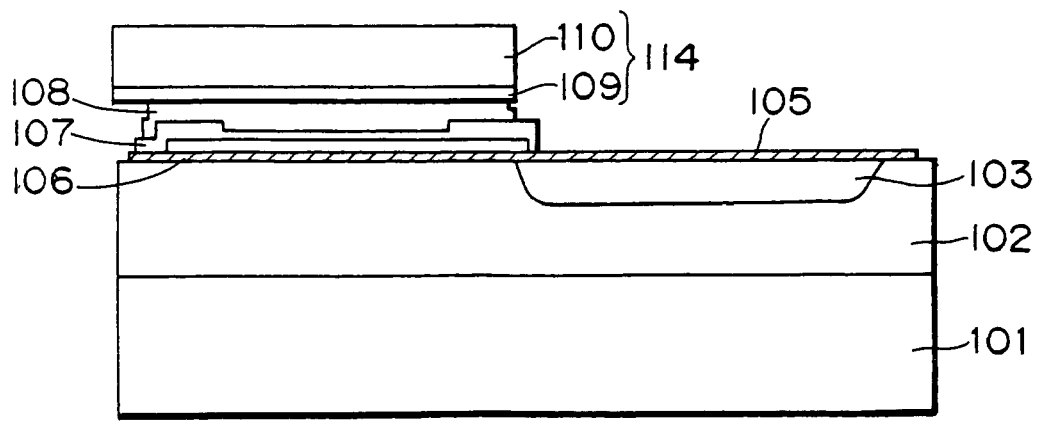
FIG. 6 is a schematic cross-sectional view along line V—V in FIG. 5.
Figure 7:
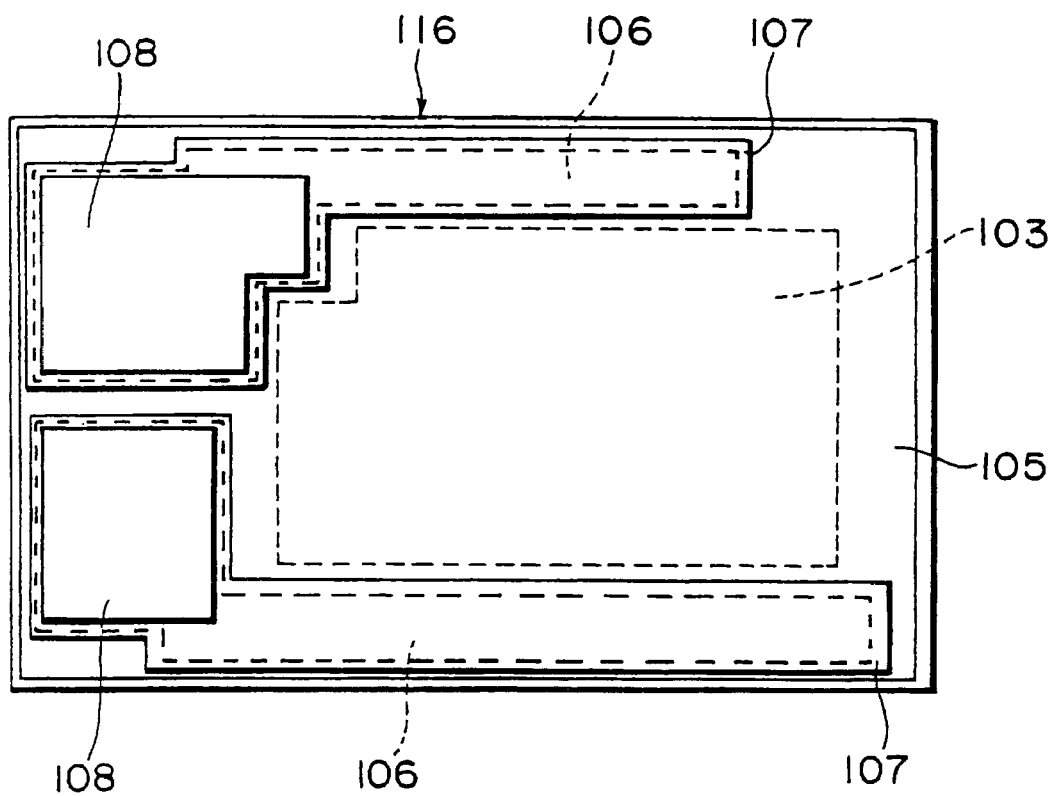
FIG. 7 is a schematic plan view showing the conventional two-wavelength semiconductor laser device.

FIG. 8 is a view showing an equivalent circuit of the conventional two-wavelength semiconductor laser device shown in FIGS. 5–7 for comparison, and like circuit elements are designated by like reference numerals in FIGS. 5–7. In the figure, reference numerals 114a and 114k denote an anode terminal 114a connected to the electrode 108 on the P-type layer 109 side and a cathode terminal 114k connected to the electrode on the N-type layer 110 side, respectively, of the red laser diode 114 shown in FIG. 5. Reference numerals 115a and 115k denote an anode electrode 115a connected to the electrode on the P-type layer 112 side and a cathode terminal 115k connected to the electrode 108 on the N-type layer 111 side, respectively, of the infrared laser diode 115 shown in FIG. 5. In this conventional two-wavelength semiconductor laser device, both the red and infrared laser diodes 114, 115 are electrically isolated from a silicon submount with a photodiode by an insulating film 105, and the anode terminal 114a of the red laser diode 114 and the cathode terminal 115k of the infrared laser diode 115 are also isolated from each other, and the cathode terminal 114k of the red laser diode 114 and the cathode terminal 115k of the infrared laser diode 115 are connected to each other via an external circuit not shown in FIG. 5. Therefore, the equivalent circuit shown in FIG. 8 is obtained.

In this conventional red laser diode 114, when a spike noise in a reverse direction is mixed in from the outside as in the above embodiment, the red laser diode 114 is affected by the external noise unlike the above embodiment since no circuit is included to allow this noise to bypass the red laser diode 114.

In the above embodiment, an insulating film immediately under the electrode of the infrared laser diode 15 is also removed. This is because insulation is not particularly necessary since the infrared laser 15 is joined with the silicon submount 16 on the same polarity side.

In the above embodiment, an N-type silicon submount 16 is used, but a P-type silicon submount may be used. Furthermore, a semiconductor submount made of a semiconductor other than silicon may be used.

The film thickness of the TiW electrode is preferably 300–750 nm. When the film thickness of the TiW electrode is 300–750 nm, penetration of the TiW layer by the melted AuSn electrode 8 can be prevented.

The diffusion depth of the N-type diffusion region 4A is preferably 1.5–4.0 μm. Even when a melted electrode is projected towards the silicon submount 16, a short circuit of the electrode with the P-type diffusion region 3A can be prevented when the diffusion depth of the N-type diffusion region 4A is 1.5–4.0 μm.

The temperature for melting the AuSn electrode 8 to mount the red laser diode 14 and the infrared laser diode 15 is preferably 360–400° C. When the temperature for melting the AuSn electrode 8 is 360–400° C., wettability of the AuSn electrode 8 for the Au electrode on rear surfaces of the red laser diode 14 and the infrared laser diode 15 can be ensured. Furthermore, since the temperature for melting the AuSn electrode 8 is 360–400° C., heat damage to the red laser diode 14 and the infrared laser diode 15 and penetration of a barrier metal by the AuSn electrode 8 can be prevented.

Furthermore, in the above embodiment, no Al electrode is disposed under the red laser diode 14 unlike the conventional device in FIG. 5. That is, the electrode under the red laser diode 14 does not contain Al. This is because the electrode under the red laser diode 14 does not need to have an ohmic contact with a substrate, that is, the silicon submount 16. Furthermore, the electrode under the red laser diode 14 does not contain Al so that a spike does not occur even when the melted AuSn electrode 8 penetrates TiW and is directly diffused in the silicon submount 16.

Furthermore, the electrode under the infrared laser diode 15 is constituted by a structure of Al, TiW, Au and AuSn from the silicon submount 16 side, but may constituted by a structure of TiW, Au and AuSn from the silicon submount 16 side. That is, Al may be omitted from the electrode under the infrared laser diode 15.

Furthermore, the polarity of the red laser diode 14 on the silicon submount 16 side may be an N type, while the polarity of the infrared laser diode 15 on the silicon submount 16 side may be a P type.

Furthermore, the number of emission points of the first semiconductor laser element is not limited to one. It is needless to say that the present invention can be applied to a semiconductor laser device including a semiconductor laser having two emission points with different emission wavelengths formed on one substrate, for example.

When the semiconductor laser device of the present invention is used as a light source of a light pickup, an optical system in which two laser light optical axes are matched does not need to be used, and hence the constitution of an optical system can be simplified. Furthermore, since only one semiconductor laser device is required, the optical system can be made small.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device, comprising:
   first and second semiconductor laser elements;
   an electrode die-bonded to the first semiconductor laser element; and
   a semiconductor submount of a first conductive type that includes a first diffusion region of a second conductive type and a second diffusion region of the first conductive type formed in the first diffusion region such that said electrode is directly connected to said second diffusion region, wherein said first and second semiconductor laser elements are connected to said semiconductor submount and polarities of the first and second semiconductor laser on the semiconductor submount side are different from each other.

2. The semiconductor laser device according to claim 1, wherein
   the electrode for mounting the first semiconductor laser element has a structure of TiW, Au and AuSn from the semiconductor submount side.

3. The semiconductor laser device according to claim 1, wherein
   an electrode for mounting the second semiconductor laser element has a structure of TiW, Au and AuSn from the semiconductor submount side.

4. The semiconductor laser device according to claim 2, wherein
   a film thickness of the TiW is 300–750 nm.

5. The semiconductor laser device according to claim 1, wherein
   a diffusion depth of the second diffusion region is 1.5–4.0 $\mu$m.

6. The semiconductor laser device according to claim 1, wherein
   the first semiconductor laser element is an AlGaInP 650-nm band red laser diode with a junction-side down, and
   the second semiconductor laser element is a GaAlAs 780-nm band infrared laser diode having an active layer positioned at a center in a height direction.

7. The semiconductor laser device according to claim 1, wherein
   the semiconductor submount is made of Si, the first conductive type is an N type, and the second conductive type is a P type.

8. The semiconductor laser device according to claim 1, wherein
   a photodiode for monitoring an output is formed on the semiconductor submount.

9. A method of manufacturing the semiconductor laser device according to claim 2, wherein
   the temperature for melting AuSn is 360–4000° C.

10. The semiconductor laser device according to claim 1, wherein
    the second semiconductor laser element and the semiconductor submount are connected via the electrode of the second semiconductor laser element.

11. The semiconductor laser device according to claim 1, wherein
    a third diffusion region of the first conductive type is included in the semiconductor submount so as to be positioned under the second semiconductor laser element, and the second diffusion region and the third diffusion region are electrically short-circuited.

* * * * *